(12) United States Patent
Ihara et al.

(10) Patent No.: US 7,360,907 B2
(45) Date of Patent: *Apr. 22, 2008

(54) MICRO CORNER CUBE ARRAY, METHOD OF MAKING THE MICRO CORNER CUBE ARRAY, AND DISPLAY DEVICE

(75) Inventors: Ichiro Ihara, Nishinomiya (JP); Kiyoshi Minoura, Tenri (JP); Yutaka Sawayama, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/489,506

(22) Filed: Jul. 20, 2006

(65) Prior Publication Data

US 2006/0256438 A1 Nov. 16, 2006

Related U.S. Application Data

(62) Division of application No. 10/315,192, filed on Dec. 10, 2002, now Pat. No. 7,098,137.

(30) Foreign Application Priority Data

Dec. 13, 2001 (JP) .............................. 2001-380539

(51) Int. Cl.
*G02B 5/124* (2006.01)
(52) U.S. Cl. ...................... 359/530; 349/113
(58) Field of Classification Search ..................... None
See application file for complete search history.

(56) References Cited

U.S. PATENT DOCUMENTS

| | | | |
|---|---|---|---|
| 3,765,969 A | 10/1973 | Kragness et al. | |
| 3,905,682 A | 9/1975 | Meyerbhofer | |
| 4,066,331 A | 1/1978 | Lindner | |
| 4,526,439 A | 7/1985 | Okoshi et al. | |
| 4,703,999 A | 11/1987 | Benson | |
| 4,992,699 A | 2/1991 | McClure et al. | |

(Continued)

FOREIGN PATENT DOCUMENTS

JP     54-105998     8/1979

(Continued)

OTHER PUBLICATIONS

"Integrated Circuit Fabrication Technology", Elliott, McGraw-Hill Book Company, pp. 248-251.

(Continued)

*Primary Examiner*—James Phan
(74) *Attorney, Agent, or Firm*—Nixon & Vanderhye P.C.

(57) ABSTRACT

A method of making a micro corner cube array includes the steps of: providing a substrate, at least a surface portion of which consists of cubic single crystals and which has a surface that is substantially parallel to {111} planes of the crystals; and dry-etching the surface of the substrate anisotropically with an etching gas that is reactive with the substrate, thereby forming a plurality of unit elements of the micro corner cube array on the surface of the substrate. Each of the unit elements is made up of a number of crystal planes that have been etched at a lower etch rate than the {111} planes of the crystals.

3 Claims, 6 Drawing Sheets

U.S. PATENT DOCUMENTS

| | | | |
|---|---|---|---|
| 5,132,823 | A | 7/1992 | Kamath et al. |
| 5,182,663 | A | 1/1993 | Jones |
| 5,346,581 | A | 9/1994 | Tsang |
| 6,010,223 | A * | 1/2000 | Gubela, Sr. .................. 359/529 |
| 6,461,003 | B1 * | 10/2002 | Neudeck ..................... 359/529 |
| 6,788,366 | B2 | 9/2004 | Sawayama et al. |
| 6,819,507 | B2 | 11/2004 | Minoura et al. |
| 7,098,137 | B2 * | 8/2006 | Ihara et al. .................. 438/706 |
| 7,098,976 | B2 * | 8/2006 | Minoura et al. ............ 349/113 |
| 2001/0040717 | A1 | 11/2001 | Minoura et al. |
| 2002/0154408 | A1 | 10/2002 | Minoura et al. |
| 2003/0053015 | A1 | 3/2003 | Minoura et al. |

FOREIGN PATENT DOCUMENTS

| | | |
|---|---|---|
| JP | 02-181923 | 7/1990 |
| JP | 3-186816 | 8/1991 |
| JP | 7-205322 A | 8/1995 |
| JP | 8-321483 A | 12/1996 |
| JP | 9-076245 | 3/1997 |
| JP | 10-206611 | 8/1998 |
| JP | 11-007008 | 1/1999 |
| JP | 2000-019490 | 1/2000 |
| JP | 2000-221497 | 8/2000 |
| JP | 2001-013310 | 1/2001 |
| WO | 98/56966 A1 | 12/1998 |
| WO | 98/57212 | 12/1998 |

OTHER PUBLICATIONS

"Optimization of the Hydrazine-Water Solution for Anisotropic Etching of Silicon in Integrated Circuit Technology", Declercq et al., Stanford Electronics Laboratories, p. 545.

U.S. Appl. No. 10/315,192, filed Dec. 10, 2002.

Kaneko, Control of Atomic Arrangement by Inverse Epitaxy (Semiconductor Atomic Layer Process by On-the-Spot Etching Technique), "Reports of Research and Development Results in 1998 Academic Research Backup Project", Published by Hyogo Science and Technology Association, Nov. 1999 and partial English translation thereof.

Chinese Office Action and English translation thereof, mailed May 28, 2004 in corresponding Chinese Application No. 02157421.9.

U.S. Appl. No. 10/171,651, filed Jun. 17, 2002.

U.S. Appl. No. 09/821,686, filed Mar. 30, 2001.

Neudeck, G. et al; "Precision Crystal Corner Cube Arrays for Optical Gratings Formed by (100) Silicon Planes With Selective Epitaxial Growth"; Applied Optics, vol. 35, No. 19, Jul. 1, 1996, pp. 3466-3470.

Japanese Office Action issued Dec. 27, 2005 (w/English translation thereof).

* cited by examiner

FIG.1A
FIG.1B
FIG.1C
FIG.1D
FIG.1E
FIG.1F
FIG.1G
FIG.1H

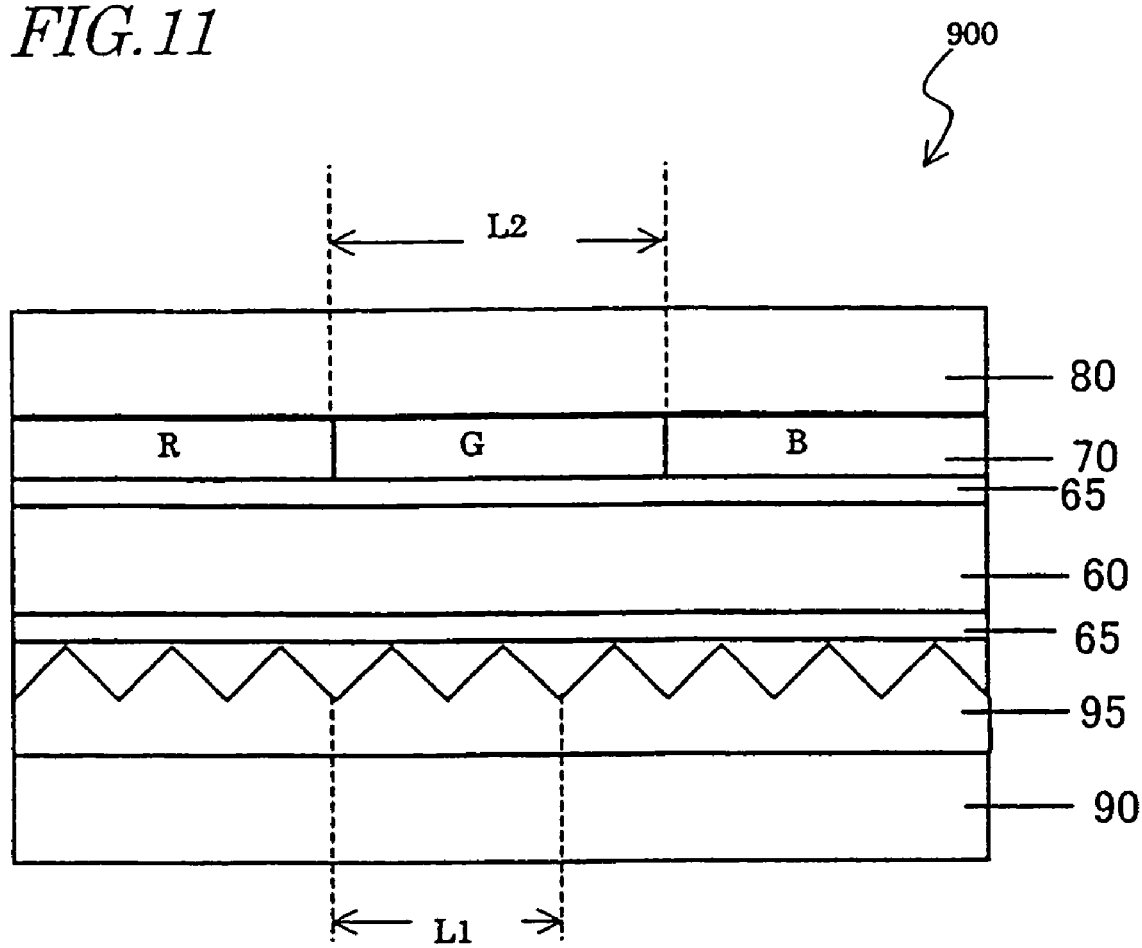

MICRO CORNER CUBE ARRAY, METHOD OF MAKING THE MICRO CORNER CUBE ARRAY, AND DISPLAY DEVICE

This application is a Divisional of application Ser. No. 10/315,192, filed Dec. 10, 2002, now U.S. Pat. No. 7,098,137, the entire content of which is hereby incorporated herein by reference in this application.

BACKGROUND OF THE INVENTION

1. Field of the Invention

The present invention relates to a method of making a micro corner cube array and to a display device including the micro corner cube array.

2. Description of the Related Art

In recent years, various types of optical elements having extremely small sizes (i.e., so-called "micro optical elements"), including microlenses, micro mirrors and micro prisms, have been developed and applied more and more extensively to the fields of optical communications and display devices. It is expected that the optical technology and display technology will be further developed and advanced by realizing those micro optical elements.

Examples of such optical elements include a corner cube reflector, which is formed by arranging a plurality of corner cubes in a regular pattern. Each of those corner cubes has a shape corresponding to one corner of a cube and three perpendicularly opposed reflective planes. The corner cube reflector is a type of retroreflector for reflecting an incoming light ray back to its source by getting the light ray reflected by each one of those reflective planes after another. The corner cube reflector can always reflect the incoming light ray back to its source irrespective of its angle of incidence. Hereinafter, conventional methods of making a corner cube will be described.

Plate Method

In a plate method, a number of flat plates, each having two mutually parallel planes, are stacked one upon the other. At the side end face of these flat plates stacked, V-grooves are cut vertically to the parallel planes at an equal pitch, thereby forming a series of roof-shaped protrusions, each having an apical angle of approximately 90 degrees. Next, each of these flat plates is horizontally shifted with respect to adjacent one of them such that the tops of the series of roof-shaped protrusions, formed on the former plate, are aligned with the bottoms of the V-grooves formed on the latter plate. In this manner, a die for use to make a corner cube array is obtained. In the plate method, a corner cube array is made by using this die. According to this method, however, it is necessary to accurately shift and secure the flat plate having the roof-shaped protrusions with respect to the adjacent flat plate such that these two plates satisfy a required positional relationship. Thus, it is difficult to make a corner cube of as small a size as about 100 μm or less by this method.

Pin Bundling Method

In a pin bundling method, the end of a hexagonal columnar metal pin is provided with a prism having three square facets that are opposed substantially perpendicularly to each other, and a number of such pins are bundled together to make a collection of prisms. In this manner, a corner cube is made up of three facets of three prisms that are formed at the respective ends of three adjacent pins. According to this method, however, a corner cube should be made by collecting multiple prisms that have been separately formed for mutually different pins. Thus, it is actually difficult to make a corner cube of a small size. The minimum possible size of a corner cube that can be formed by this method is about 1 mm.

Triangular Prism Method

In a triangular prism method, V-grooves are cut on the surface of a flat plate of a metal, for example, in three directions, thereby forming a plurality of triangular pyramidal protrusions and obtaining a collection of prisms. However, the prisms to be formed by this method can have no other shape but the triangular pyramidal shape.

Furthermore, Japanese Laid-Open Publication No. 7-205322 discloses a method of making a micro corner cube array by a photochemical technique. In this method, a mask having a plurality of equilateral triangular transparent (or opaque) regions is used. Each of these transparent (or opaque) regions of this mask has variable transmittance (or opacity) that gradually decreases from its center toward its periphery. By performing exposing and developing process steps with such a mask, a number of triangular pyramidal photoresist pattern elements are formed on a substrate. Then, the substrate, which is partially covered with those photoresist pattern elements, is etched anisotropically (e.g., dry etched) so as to have a plurality of protrusions in the same shape as the photoresist pattern elements. In this manner, multiple triangular pyramidal protrusions, each having three isosceles triangular facets that are opposed substantially perpendicularly to each other, are formed on the substrate.

A liquid crystal display device, which uses such a corner cube reflector as a retroreflector, is described in U.S. Pat. No. 5,182,663, for example. Hereinafter, a conventional liquid crystal display device including such a corner cube reflector will be described with reference to FIG. 11.

In the liquid crystal display device 900 shown in FIG. 11, a scattering type liquid crystal layer 60 is sandwiched between two transparent substrates 80 and 90, which are closer to, and more distant from, the viewer (not shown), respectively, and will be herein referred to as a "viewer-side substrate" and a "non-viewer-side substrate", respectively. On one surface of the non-viewer-side substrate 90 that is opposed to the liquid crystal layer 60, a corner cube reflector 95 used as a retroreflector and a transparent electrode 65 are provided in this order. On the other hand, on one surface of the viewer-side substrate 80 that is opposed to the liquid crystal layer 60, a color filter layer 70 and another transparent electrode 65 are provided in this order. By applying a predetermined voltage or no voltage from the pair of transparent electrodes 65, which sandwiches the scattering type liquid crystal layer 60 between them, to the liquid crystal layer 60, the liquid crystal layer 60 can switch between transmitting and scattering states. When color white should be displayed, the scattering type liquid crystal layer 60 is switched into the scattering state. In this mode, part of the incoming light, which has been incident from an external light source (e.g., the sun) onto the scattering type liquid crystal layer 60, is scattered by the liquid crystal layer 60. Another part of the incoming light is reflected back from the corner cube reflector 95 and then scattered by the liquid crystal layer 60. By getting the incoming light scattered in this manner, a bright image can be displayed. On the other hand, when color black should be displayed, the scattering type liquid crystal layer 60 is switched into the transmitting state. In this mode, part of the incoming light that has been transmitted through the scattering type liquid crystal layer 60 is reflected back to its source by the corner cube reflector 95. Accordingly, just a part of the light that has been emitted from a light source near the viewer reaches his or her eyes, thus realizing good display of color black. In addition, no regularly reflected part of the ambient light reaches the viewer's eyes. As a result, the unwanted back reflection of the surrounding sight is avoidable.

In this liquid crystal display device 900, the size L1 of each unit element (i.e., each corner cube) of the corner cube reflector 95 needs to be equal to or smaller than the size L2 of each pixel region. The reason is as follows. If the size L1 of each unit element is greater than the size L2 of each pixel region, then a light ray, which has been transmitted through a predetermined pixel region and then retro-reflected from the corner cube reflector, may pass through another pixel region on the way back. In that case, the display operation may not be conducted as intended.

As described above, a corner cube for use in a liquid crystal display device, for example, needs to have a very small size (e.g., about 100 μm or less, which is even smaller than the size of a pixel region). However, according to any of the above-described mechanical methods of making corner cubes, it is often difficult to make corner cubes of such a small size as intended due to some variations that should occur in an actual manufacturing process. Also, even if corner cubes of a very small size are obtained successfully by one of the methods described above, each reflective plane of the corner cubes should have a low specular reflectivity and the radius R of curvature at each intersection between two reflective planes should be great. As a result, the efficiency of retro-reflection may decrease disadvantageously.

Also, as for a micro corner cube obtained by a photochemical method as disclosed in Japanese Laid-Open Publication No. 7-205322, it is difficult to ensure high plane precision (i.e., planarity) for each side surface (or reflective plane) thereof. In that method, the plane precision of each side surface of a micro corner cube depends on that of a triangular pyramidal photoresist pattern element formed on the substrate. However, to increase the plane precision of the photoresist pattern element, the processing steps of exposing and developing the photoresist layer should be controlled strictly enough by making the variation in transmittance or opacity of the mask constant, for example. Actually, though, such strict process control is hard to realize. Furthermore, according to this technique, every corner cube must be made up of three rectangular isosceles triangular planes.

SUMMARY OF THE INVENTION

In order to overcome the problems described above, an object of the present invention is to provide a method of making a micro corner cube array with a very small size and sufficiently high shape precision.

Another object of the present invention is to provide a display device that uses such a micro corner cube array.

A preferred embodiment of the present invention provides a method of making a micro corner cube array. The method preferably includes the steps of a) providing a substrate, at least a surface portion of which consists of cubic single crystals and which has a surface that is substantially parallel to {111} planes of the crystals, and b) dry-etching the surface of the substrate anisotropically with an etching gas that is reactive with the substrate, thereby forming a plurality of unit elements of the micro corner cube array on the surface of the substrate. Each of the unit elements is preferably made up of a number of crystal planes that have been etched at a lower etch rate than the {111} planes of the crystals.

In one preferred embodiment of the present invention, the step b) preferably includes the step of exposing {100} planes of the crystals at the lower etch rate than the {111} planes thereof.

In this particular preferred embodiment, the step b) preferably includes the step of forming the unit elements such that each of the unit elements is made up of three {100} planes that are opposed substantially perpendicularly to each other.

Alternatively or additionally, at least the surface portion of the substrate prepared in the step a) is preferably made of a compound semiconductor having a sphalerite structure.

In that case, the compound semiconductor is preferably gallium arsenide and the surface of the substrate is preferably substantially parallel to {111}A planes that are formed by gallium atoms.

In another preferred embodiment of the present invention, the step b) preferably includes the step of dry-etching the surface of the substrate anisotropically with an etching gas including a halogen compound.

In a specific preferred embodiment, the etching gas may include a compound of arsenic and bromine.

In an alternative preferred embodiment, the etching gas may include a compound of arsenic and chlorine.

In still another preferred embodiment, the step b) preferably includes the step of dry-etching the surface of the substrate under such an etching condition as to fall within a surface-reaction-limited range.

In yet another preferred embodiment, the step b) preferably includes the step of dry-etching the surface of the substrate with not only the etching gas but also an arsenic gas as well.

In yet another preferred embodiment, the method preferably further includes, between the steps a) and b), the step c) of covering the surface of the substrate with an etching mask layer. The etching mask layer preferably includes at least one masking element and at least one opening that are arranged to form a predetermined pattern.

In this particular preferred embodiment, the step b) preferably includes the step of forming the unit elements of the micro corner cube array such that the size of each of the unit elements is controlled according to the pattern of the etching mask layer that has been defined in the step c).

In yet another preferred embodiment, the step b) preferably includes the step of forming the unit elements such that each of the unit elements is made up of three substantially square planes that are opposed substantially perpendicularly to each other.

In yet another preferred embodiment, the method may further include the step of transferring the shape of the unit elements, which have been formed on the surface of the substrate, to a resin material.

Another preferred embodiment of the present invention provides a micro corner cube array that is made by the method according to any of the preferred embodiments of the present invention described above.

Still another preferred embodiment of the present invention provides a display device. The display device preferably includes the micro corner cube array according to any of the preferred embodiments of the present invention described above and a light modulating layer provided on the micro corner cube array.

In one preferred embodiment of the present invention, the micro corner cube array preferably includes a plurality of corner cubes as the unit elements, and a size of each of the corner cubes is preferably equal to or smaller than that of each pixel region.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 1A through 1H are cross-sectional views illustrating respective process steps for making a micro corner cube array according to a first specific preferred embodiment of the present invention.

FIG. 11 is a cross-sectional view illustrating a configuration for a conventional reflective liquid crystal display device including a micro corner cube array.

DETAILED DESCRIPTION OF PREFERRED EMBODIMENTS

Figure 2:
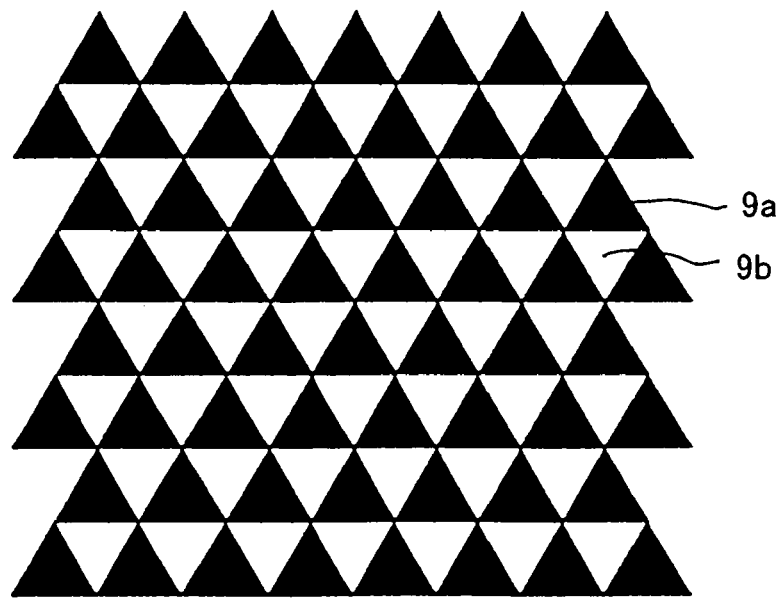
FIG. 2 is a plan view illustrating a photomask for use in the process of making the micro corner cube array of the first preferred embodiment.

In a method of making a micro corner cube array according to a preferred embodiment of the present invention, a micro corner cube array is formed on a single crystalline substrate consisting of cubic crystals (which will be herein referred to as a "cubic single crystalline substrate"). The cubic single crystalline substrate may be made of a compound semiconductor having a sphalerite structure or a material having a diamond structure, for example. More specifically, a cubic single crystalline substrate, having a surface that is substantially parallel to {111} planes of the crystals, is prepared and has that surface patterned by an anisotropic dry etching process, thereby making a micro corner cube array.

It should be noted that the "substrate having a surface that is substantially parallel to {111} planes of crystals" herein refers to not only a substrate having a surface that is parallel to the {111} planes of the crystals but also a substrate having a surface that defines a tilt angle of about 0 degrees to about 10 degrees with the {111} planes of the crystals.

The method of the present invention is partly characterized by patterning the surface of the substrate by an anisotropic dry etching process such that the etch rate of one family of crystal planes is different from that of another. For example, if a single crystalline substrate of GaAs is dry-etched with a reactive etching gas such as a gas of a halogen compound, the etch rate of {111}A planes of the crystals (i.e., {111} planes formed by gallium atoms) is relatively high, while the etch rate of {100} planes (i.e., crystal planes including (100), (010) and (001) planes) thereof is relatively low. Accordingly, if the {111}A planes of a GaAs substrate are exposed and subjected to the dry etching process, then the dry etching process advances anisotropically in such a manner as to leave the {100} planes of the crystals. As a result, concavo-convex portions are defined on the surface of the substrate by multiple unit elements such that each unit element is made up of three {100} planes of the crystals. As used herein, each "unit element", defined by a {100} family of planes, will also be referred to as a "concave portion" because the element is formed by an anisotropic etching process. Each of those unit elements obtained in this manner has three perpendicularly opposed planes (e.g., (100), (010) and (001) planes), thus forming a corner cube.

In a corner cube array formed by such a method, the three planes of each corner cube are {100} crystallographic planes of a cubic crystal and exhibit very high shape precision. Also, the three planes that make up each corner cube have good planarity, and each corner or edge, at which two or three of the planes intersect with each other, has sufficient sharpness. Furthermore, the corner cube array has a stereoscopic shape in which multiple unit elements, or corner cubes, are arranged in a regular pattern. In this array, the respective vertices of the corner cubes are located at substantially the same level (or within substantially the same plane). Thus, such a corner cube array can be used effectively as a retroreflector for reflecting an incoming light ray back to its source.

Also, the size of each unit element (i.e., each corner cube) of the corner cube array formed by the method of the present invention may be several tens μm or less by adjusting the feature size of a photoresist pattern (or resist mask) used in the etching process. Accordingly, a corner cube array having a very small size, which is suitably applicable for use as a retroreflector for a liquid crystal display device, for example, can be obtained.

It should be noted that the "cubic single crystalline substrate" used in various preferred embodiments of the present invention includes a substrate that is prepared by forming a single crystal layer on a supporting base member of an amorphous or polycrystalline material. Also, the substrate does not have to be a flat plate but may have any other stereoscopic shape as long as the substrate has a flat surface.

Hereinafter, preferred embodiments of the present invention will be described with reference to the accompanying drawings.

Embodiment 1

In a first specific preferred embodiment of the present invention, a GaAs substrate is used as a cubic single crystalline substrate, on which a micro corner cube array should be formed.

FIGS. 1A through 1H illustrate respective process steps for making a micro corner cube array according to the first preferred embodiment of the present invention. First, as shown in FIG. 1A, a substrate 1, which consists of GaAs single crystals and of which the surface is one of {111}A planes, is prepared, and has that surface mirror-polished. It should be noted that the {111}A planes are formed by gallium atoms, while {111}B planes are formed by arsenic atoms.

Next, as shown in FIG. 1B, an $SiO_2$ film 3 is deposited to a thickness of about 3,000 Å on the substrate 1 by a CVD process. Then, the $SiO_2$ film 3 is spin-coated with a resist film 5 with a thickness of about 2 μm as shown in FIG. 1C. The resist film 5 may be made of OFPR-800 (produced by Tokyo Ohka Kogyo Co., Ltd.), for example.

Subsequently, after the resist film 5 has been pre-baked, a photomask having a predetermined pattern is disposed over the resist film 5, thereby selectively exposing the resist film 5 to a radiation and developing the resist film 5. In this manner, a predetermined resist masking pattern 5a is defined on the $SiO_2$ film 3 as shown in FIG. 1D.

In this preferred embodiment, a photomask such as that shown in FIG. 2 may be used. As shown in FIG. 2, in this photomask, equilateral triangular opaque regions 9a and inverse equilateral triangular transparent regions 9b are alternately arranged in each of the three directions defined by the three sides of the triangles. The photomask is preferably disposed over the substrate so that one of the three sides (or edges) of each equilateral triangular opaque region 9a of the photomask is parallel to the (100) plane of the GaAs crystal. In this preferred embodiment, each equilateral triangular pattern element of the photomask has a length of about 10 μm each side.

Next, the substrate with the resist masking pattern 5a thereon is wet-etched with a buffered hydrofluoric acid (HF) so that the resist masking pattern 5a is transferred onto the $SiO_2$ film 3. In this manner, an $SiO_2$ masking pattern 3a is defined on the substrate 1 as shown in FIG. 1E. Thereafter, the resist masking pattern 5a is stripped by washing the substrate with an organic solvent such as acetone and then the $SiO_2$ film 3 is heated to about 200° C. by an oven so as to be dehydrated as shown in FIG. 1F. As a result, an etching mask layer 3a to be used in a subsequent dry etching process is obtained as the $SiO_2$ masking pattern 3a. The $SiO_2$ masking pattern 3a that has been formed in this manner has the same pattern as the photomask shown in FIG. 2.

In this preferred embodiment, the size of corner cubes to be formed is determined by the feature size of the $SiO_2$ masking pattern 3a. More specifically, the size of the corner cubes to be formed becomes approximately equal to the pitch between the centers of mass of two adjacent masking elements of the $SiO_2$ masking pattern 3a. In this preferred embodiment, the pitch is preferably about 10 μm.

Figure 3:
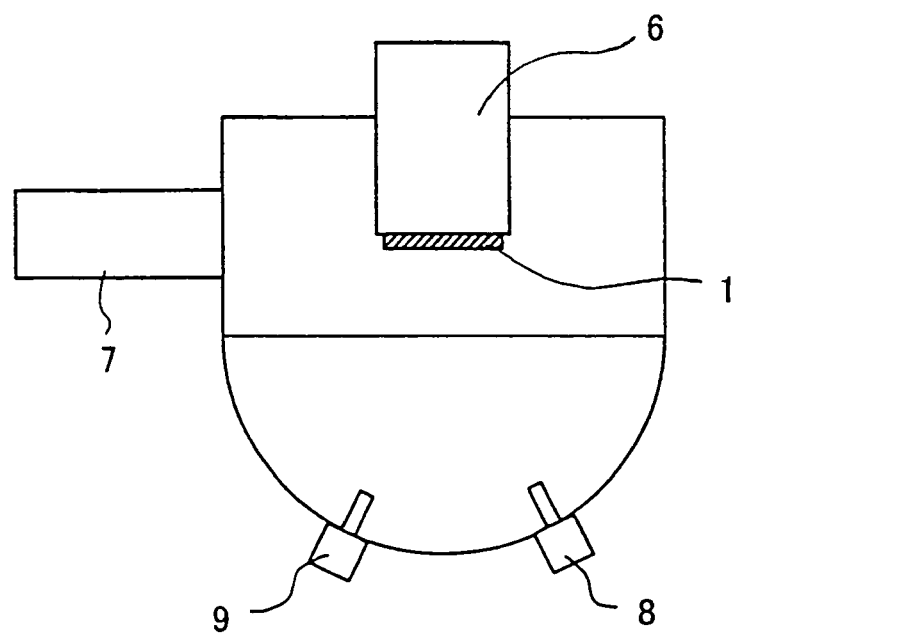
FIG. 3 is a cross-sectional view illustrating an etching system for use in the process of making the micro corner cube array of the first preferred embodiment.

Next, the GaAs substrate 1, including the $SiO_2$ masking pattern 3a thereon, is loaded into an etching system 30 such as that shown in FIG. 3, thereby dry-etching the surface of the substrate 1.

More specifically, the substrate 1 is fixed on a heater 6 of the etching system 30 and then the system is evacuated to a vacuum of about $1 \times 10^{-9}$ Torr with a vacuum pump 7. Next, the GaAs substrate 1 is heated by the heater 6 to about 590° C. and retained at the temperature for approximately 30 minutes while arsenic gas is supplied from an arsenic gas supplier 9 into the chamber. In this manner, a natural oxide film that has been formed on the surface of the GaAs substrate 1 is removed. Then, the supply of the arsenic gas is stopped and the temperature of the substrate is decreased to about 380° C. Thereafter, an etching gas is introduced from an etching gas supplier 8 into the chamber for approximately 10 hours, thereby dry-etching the surface of the substrate 1 anisotropically. In this preferred embodiment, arsenic tribromide gas is used as the etching gas. Alternatively, arsenic trichloride gas or any other suitable gas may also be used as the etching gas.

To etch the surface of the substrate anisotropically by this dry etching process, the etching gas used needs to be chemically reactive with the substrate. When a reactive etching gas is used, a chemical reaction occurs between the surface of the substrate and the etching gas. In that case, the reactivity of the etching gas with a family of crystal planes of the substrate is different from that of the same etching gas with another family of crystal planes thereof. Thus, those two families of crystal planes are etched at mutually different etch rates. As a result, the surface of the substrate is dry-etched anisotropically.

Also, the etching gas used preferably produces a gaseous reactant having a high vapor pressure when reacted with the substrate.

For these reasons, a gas of a halogen compound such as the arsenic tribromide or trichloride gas described above is preferably used as the etching gas. Examples of other preferred gases that satisfy these conditions include hydrogen gas.

The technique of etching a GaAs substrate with an etching gas of a halogen compound has already been known in the art. For example, an etching process using hydrogen chloride gas is described in Surface Science 312, 181 (1994). An etching process using hydrogen trichloride is described in Journal of Crystal Growth 164, 97 (1994). Also, a method of etching a GaAs substrate with an etching gas of arsenic tribromide is described in Japanese Laid-Open Publication No. 8-321483. Each of these documents discloses that the etching process can be carried out with very high precision by using a halogen compound as an etchant. In this preferred embodiment, such a high-precision etching technique is used to make a micro corner cube array, thereby obtaining a reflector with a very high retro-reflectivity.

In the dry etching process of this preferred embodiment, the {100} planes of the GaAs single crystals, including the (100), (010) and (001) planes, are less easy to etch than the {111}A planes thereof. Thus, the etching process advances anisotropically so as to leave the {100} planes. In this preferred embodiment, the substrate is dry-etched with an etching gas including a halogen compound. Accordingly, the exposed {100} planes have good planarity.

Figure 4A:
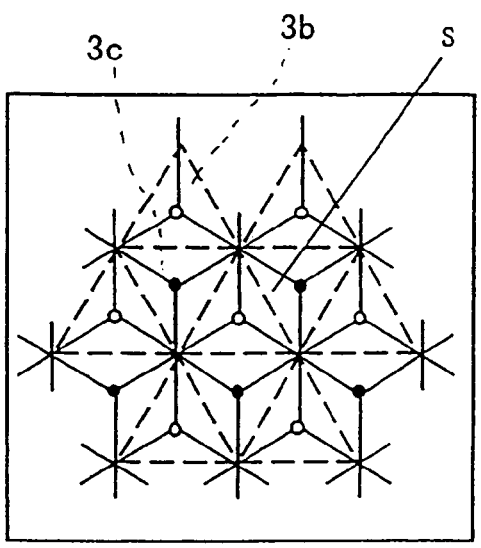
FIGS. 4A and 4B are respectively a plan view and a perspective view illustrating a micro corner cube array obtained by the method of making a micro corner cube array according to the first preferred embodiment.
Figure 4B:
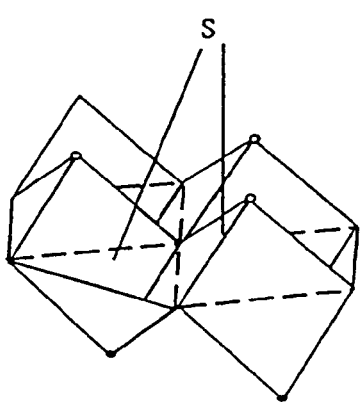

Thereafter, when the substrate 1 has been etched to the intended depth as shown in FIG. 1G, concavo-convex portions 20, consisting of the {100} planes S of the GaAs single crystals, will be formed as shown in FIGS. 4A and 4B. FIGS. 4A and 4B are respectively a plan view and a perspective view of the concavo-convex portions 20 that have been formed in this manner. As shown in FIGS. 4A and 4B, a plurality of concavo-convex portions, each consisting of three substantially perpendicularly opposed {100} planes S of GaAs single crystals, are formed so as to correspond to the masking elements 3b and openings 3c of the etching mask layer (i.e., the $SiO_2$ masking pattern) 3a. In this manner, a micro corner cube array is obtained. It should be noted that when the micro corner cube array is formed on the substrate 1 at the end of this etching process, the SiO$_2$ masking pattern 3a and the concavo-convex portions 20 on the surface of the substrate are in point contact with each other as shown in FIG. 1G. Thus, the SiO$_2$ masking pattern 3a is stripped by itself from the substrate 1 as shown in FIG. 1H.

As can be seen from FIGS. 4A and 4B, the micro corner cube array obtained in this manner has a stereoscopic shape in which multiple convex portions (of which the vertices are indicated by the open circles ○) and multiple concave portions (of which the bottoms are indicated by the solid circles ●) are combined with each other. Also, each of its unit elements (i.e., each of the corner cubes of the array) is made up of three substantially square planes that intersect with each other at the bottom and that are opposed substantially perpendicularly to each other. As shown in FIG. 4A, each unit element, or corner cube, has a substantially hexagonal planar shape as view from over the substrate 1. Thus, the corner cubes formed by the method of this preferred embodiment have a relatively complex shape. However, the corner cubes of this preferred embodiment have a very small size of about 10+μm. In addition, the shape precision (e.g., the planarity of each of the three substantially square planes) thereof is also very high.

In the preferred embodiment described above, the corner cube array is formed by using arsenic tribromide gas as an etching gas. However, a similar corner cube array can also be obtained by using arsenic trichloride gas as an alternative etching gas.

When this micro corner cube array is used to make a retroreflector, a thin film of a reflective material (e.g., aluminum or silver) may be deposited by an evaporation process, for example, to a substantially uniform thickness (e.g., about 200 nm) over the rugged surface of the GaAs substrate. In this manner, a retroreflector, including three substantially square reflective planes that are opposed substantially perpendicularly to each other, can be obtained.

Optionally, the pattern of the micro corner cube array that has been formed on the surface of the GaAs substrate may be transferred onto a resin material, for example, thereby making a micro corner cube array of the resin material. More specifically, first, an electroformed mold is made by a known technique from the GaAs substrate on which the corner cube array has been formed as described above. Next, this electroformed mold is attached onto a roller, for example. And then the electroformed mold is rotated by the roller and pressed against the resin, thereby transferring the pattern of the micro corner cube array onto the resin material.

In the preferred embodiment described above, the substrate on which the corner cube array is formed consists of GaAs single crystals. Alternatively, as long as an appropriate etching gas is used, the substrate may also consist of single crystals of any other compound having either a sphalerite structure, e.g., InP, InAs, ZnS or GaP, or a diamond structure such as Ge.

Embodiment 2

Hereinafter, it will be described how the etch rate may change with the temperature of the GaAs substrate in the anisotropic dry etching process of the first preferred embodiment described above.

Figure 5:
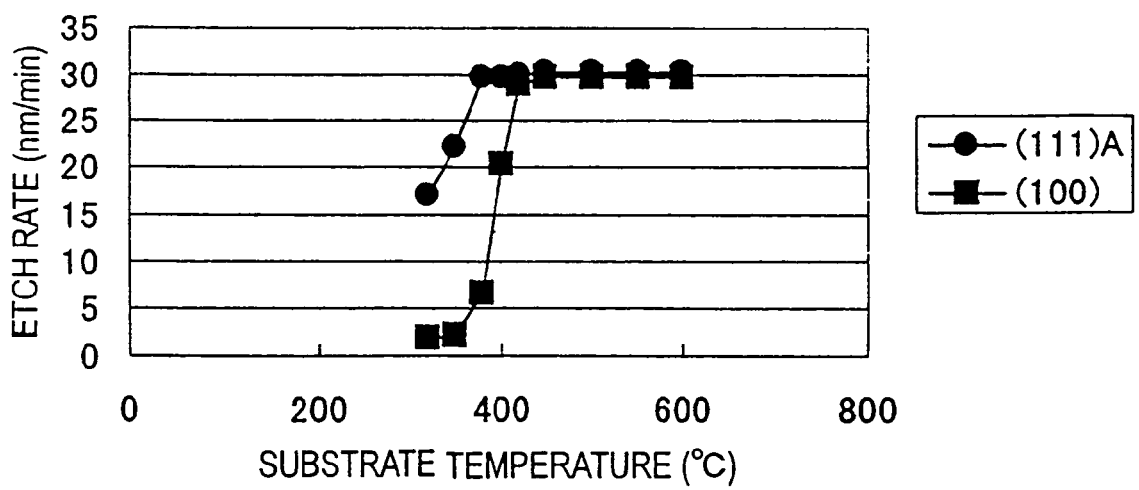
FIG. 5 is a graph showing how the etch rates of {111}A and {100} planes of GaAs single crystals change with the temperature of the substrate according to a second specific preferred embodiment of the present invention.
Figure 6:
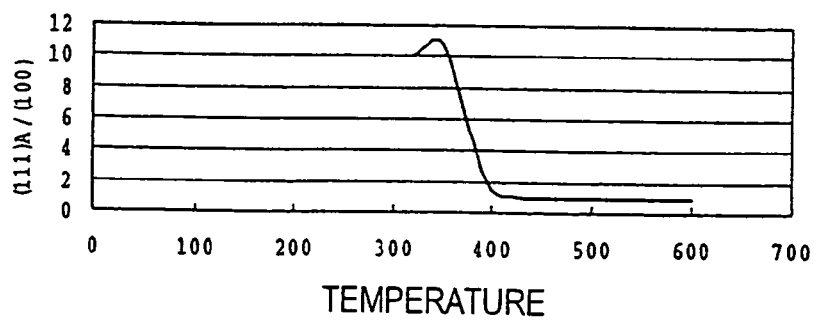
FIG. 6 is a graph showing how the etch rate ratio of the {111}A planes to the {100} planes of GaAs single crystals changes with the temperature of the substrate according to the second preferred embodiment of the present invention.

FIG. 5 is a graph showing how the etch rates of the {111}A and {100} planes of the GaAs single crystals change with the temperature of the substrate when arsenic tribromide gas is used as the etching gas. FIG. 6 is a graph showing how the ratio ($V_{111A}/V_{100}$) of the etch rate $V_{111A}$ of the {111}A planes to the etch rate $V_{100}$ of the {100} planes changes with the temperature of the substrate.

As can be seen from FIG. 5, if the temperature of the substrate is about 400° C. or less, the etch rates change relatively steeply with the temperature of the substrate. On the other hand, if the temperature of the substrate is higher than about 400° C., the etch rates change only slightly with the temperature of the substrate. The range where the etch rates change steeply will be herein referred to as a "surface-reaction-limited range" while the range where the etch rates change just slightly, or even hardly, will be herein referred to as a "mass-transport-limited range".

It should be noted that the "surface-reaction-limited range" may be defined by any of various parameters that determine the etching conditions (e.g., the substrate temperature or the pressure at which the etching gas is supplied). That is to say, each of those parameters may have its own range where the etch rate changes steeply, i.e., such a range may be defined as the "surface-reaction-limited range" for each of those parameters. As used herein, the "surface-reaction-limited range" refers to an etching condition range in which the highest etch rate of a family of crystal planes is about 1.1 times or more as high as the lowest etch rate of another family of planes.

Also, as can be seen from FIGS. 5 and 6, the ratio ($V_{111A}/V_{100}$) of the etch rate $V_{111A}$ of the {111}A planes to the etch rate $V_{100}$ of the {100} planes is large in the surface-reaction-limited range of about 400° C. or less. Meanwhile, in the mass-transport-limited range exceeding about 400° C., the etch rate ratio ($V_{111A}/V_{100}$) is very small. Thus, it can be seen that to increase the etch rate ratio ($V_{111A}/V_{100}$), the etching process is preferably carried out in the surface-reaction-limited range of about 400° C. or less.

Figure 7A:
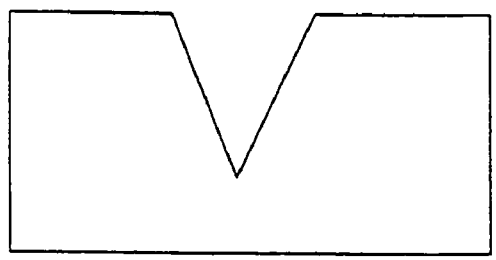
FIGS. 7A and 7B are cross-sectional views of a substrate that was etched with its temperature retained at about 380° C. and a substrate that was etched with its temperature retained at about 600° C., respectively, according to a third specific preferred embodiment of the present invention.
Figure 7B:
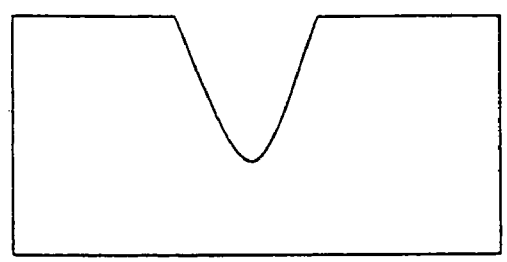

FIGS. 7A and 7B are cross-sectional views illustrating a corner cube that was formed by etching the substrate at about 380° C. falling within the surface-reaction-limited range and a corner cube that was formed by etching the substrate at about 600° C. falling within the mass-transport-limited range, respectively. As shown in FIG. 7A, when the substrate temperature is about 380° C. and the etch rate ratio of the {111}A planes to the {100} planes is large, the corner cube formed by the etching process has a sharp corner (i.e., a vertex) and planes with good planarity. On the other hand, when the substrate temperature is about 600° C. and the etch rate ratio of the {111}A planes to the {100} planes is small, the corner cube formed by the etching process has a rounded corner and curved surfaces as shown in FIG. 7B. In this manner, if the etch rate of the {111}A planes is not sufficiently higher than that of the {100} planes, the resultant corner cube has decreased shape precision.

When the corner cube obtained has such curved surfaces or rounded corner, a retroreflector to be made from such a corner cube should have decreased retro-reflectivity. Accordingly, the etching process is preferably carried out under such an etching condition (e.g., substrate temperature or pressure at which the etching gas is supplied) as resulting in a sufficiently high etch rate ratio. In this preferred embodiment, the ratio ($V_{111A}/V_{100}$) of the etch rate $V_{111A}$ of the {111}A planes to the etch rate $V_{100}$ of the {100} planes is preferably at least about 1.7, more preferably at least about 3.4.

Also, to obtain such a high etch rate ratio, the temperature of the substrate during the etching process is preferably about 350° C. to about 400° C., more preferably about 350° C. to about 385° C.

As described above, if the etch rate ratio ($V_{111A}/V_{100}$) is sufficiently high, a corner cube array with high shape precision can be formed. Also, if the etch rate ratio is increased sufficiently, the {100} crystallographic planes are exposed by themselves. Thus, other necessary conditions (e.g., the shape precision of the etching mask layer) on the etching process may be relaxed, or do not have to be controlled so strictly, which is advantageous for the overall manufacturing process.

Also, when a dry etching process is adopted as is done in this preferred embodiment, the difference in etch rate between two families of crystal planes (i.e., the etch rate ratio) can be increased more easily than a method in which a wet etching process is adopted. A method of making a corner cube by wet-etching a substrate with a mixture of ammonia water and hydrogen peroxide water was disclosed by the applicant of the present application in Japanese Patent Application No. 2001-306052. In a wet etching process, it is rather difficult to realize an etch rate ratio of about 3.4 or more between the {111} and {100} families of crystal planes. However, such a high etch rate ratio is easily realizable by a dry etching process. When the etch rate ratio is that high, {100} planes with good planarity can be formed easily and the retro-reflectivity can be further increased. In addition, compared to the wet etching process, the etching mask layer is less likely stripped in the dry etching process before the corner cubes are formed in their intended shape. Thus, an array of corner cubes with desired sharp vertices can be formed over a broad area. The present inventors confirmed via experiments that the corner cubes that had been formed by a wet etching process had a retro-reflectivity of about 71% whereas the corner cubes that had been formed by a dry etching process as in the preferred embodiments of the present invention described above had a retro-reflectivity of about 79%.

Embodiment 3

A third specific preferred embodiment of the present invention is a variation of the anisotropic dry etching process of the first preferred embodiment described above. Specifically, in this preferred embodiment, the dry etching process is carried out with not only the etching gas but also arsenic gas supplied in combination.

In this preferred embodiment, after the etching mask layer (i.e., the SiO$_2$ masking pattern) 3a with the predetermined pattern has been formed, a similar dry etching process is carried out in the etching system as in the first preferred embodiment described above. The dry etching process is carried out on the substrate having a temperature of about 380° C. as in the first preferred embodiment described above. In this third preferred embodiment, however, the substrate is simultaneously exposed to not just the arsenic tribromide gas but also arsenic gas as respective etching gases. The arsenic gas is supplied from the arsenic gas supplier 9 by heating the source of arsenic to about 203° C.

The present inventors discovered that when the substrate was additionally exposed to the arsenic gas as well as the arsenic tribromide gas, the ratio ($V_{111A}/V_{100}$) of the etch rate $V_{111A}$ of the {111}A planes to the etch rate $V_{100}$ of the {100} planes could be increased than the embodiment where the substrate was exposed to the arsenic tribromide gas only. The results are shown in the following Table 1:

TABLE 1

| | $V_{111A}/V_{100}$ |
|---|---|
| No arsenic gas supplied | 4.6 |
| Arsenic gas supplied | 6.1 |

In this manner, if the substrate being etched is additionally exposed to the arsenic gas, the etch rate ratio ($V_{111A}/V_{100}$) can be increased, and a corner cube having even higher shape precision can be formed.

In this preferred embodiment, the dry etching process is supposed to be carried out with not only the etching gas (e.g., arsenic tribromide or trichloride gas) but also the arsenic gas supplied simultaneously. Alternatively, the dry etching process may also be carried out with the etching gas and Ga gas supplied in combination.

If the etching gas and the Ga gas are supplied simultaneously during the dry etching process, then the concavo-convex portions to be formed on the surface of the substrate can have further planarized planes. The present inventors discovered and confirmed via experiments that when only the arsenic tribromide gas was supplied as the etching gas for the anisotropic dry etching process, the concavo-convex portions had a surface roughness of about 5.4 nm. On the other hand, when the arsenic tribromide gas and Ga gas (i.e., a Ga source gas that was heated to about 890° C.) were supplied simultaneously as etching gases for the anisotropic dry etching process, the concavo-convex portions could have its surface roughness decreased to about 0.2 nm.

Embodiment 4

Hereinafter, a fourth specific preferred embodiment of the present invention will be described. The fourth preferred embodiment relates to a reflective liquid crystal display device that uses, as a retroreflector, a micro corner cube array obtained by any of the methods described for the first through third preferred embodiments of the present invention.

Figure 8:
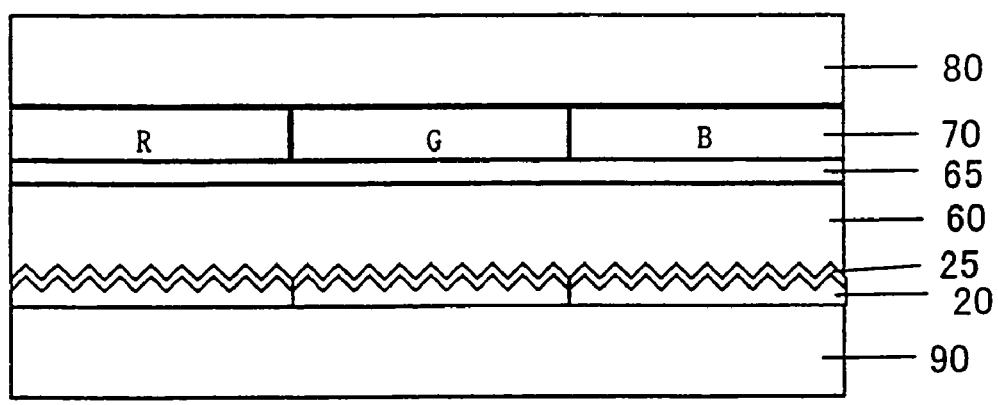
FIG. 8 is a cross-sectional view illustrating a display device according to a fourth specific preferred embodiment of the present invention.

FIG. 8 illustrates a configuration for a reflective liquid crystal display device 100 according to the fourth preferred embodiment. As shown in FIG. 8, this liquid crystal display device 100 includes a pair of substrates 80 and 90 and a scattering type liquid crystal layer 60, which is provided as a light modulating layer between the substrates 80 and 90. The substrate 80 is located closer to the viewer, while the substrate 90 is provided so as to face the substrate 80. These two substrates 80 and 90 are both made of a transparent material and may be glass plates or polymer films, for example.

On one surface of the substrate 80 that is opposed to the liquid crystal layer 60, a color filter layer 70, including R, G and B color filters, and a transparent electrode 65 are stacked in this order. On the other hand, on one surface of the substrate 90 that is opposed to the liquid crystal layer 60, a micro corner cube array 20 is provided. This micro corner cube array 20 is covered with a reflective electrode 25, which is made of a material with a high surface reflectivity (e.g., silver or aluminum) and which has a substantially uniform thickness. The reflective electrode 25 may be formed so as to come into close contact with the rugged surface of the micro corner cube array 20 by depositing silver to a thickness of about 200 nm by an evaporation process, for example. The reflective electrode 25 serves not only as reflective planes for reflecting the incoming light back to its source but also as an electrode for applying a voltage to the liquid crystal layer 60.

The liquid crystal display device 100 having such a configuration displays an image thereon by controlling the light modulating states of the liquid crystal layer 60 on a pixel-by-pixel basis with a voltage applied from the transparent electrode 65 and reflective electrode 25 to the liquid crystal layer 60. The electrodes 65 and 25 may be driven either by known active components such as thin-film transistors or by any other driver.

In the preferred embodiment illustrated in FIG. 8, the micro corner cube array 20 is formed on the substrate 90. Alternatively, the micro corner cube array 20 itself may be used as a substrate without providing the substrate 90. As already described for the first preferred embodiment, the micro corner cube array 20 may be formed out of a GaAs substrate. When a GaAs substrate is used, a circuit for driving the active components and other circuits may be integrated together on the same substrate around the display area thereof, for example. If the driver circuit and other circuits can be provided on the same substrate, then the overall size of the display device can be reduced.

In this preferred embodiment, the scattering type liquid crystal layer 60 is made of a polymer-dispersed liquid crystal material. However, the material of the liquid crystal layer 60 is not limited thereto, but may also be any other scattering type liquid crystal material such as a nematic-cholesteric phase change type liquid crystal material or a liquid crystal gel. Furthermore, the liquid crystal layer 60 may also be made of any of various other liquid crystal materials as long as the material allows the liquid crystal layer 60 to switch between a mode to transmit the incoming light and a mode to scatter the light at least. Specifically, examples of other usable liquid crystal materials include: a cholesteric liquid crystal material, which can switch between transmitting and reflecting states and to which diffusion properties are imparted by controlling the domain sizes of liquid crystal molecules; and a polymer-dispersed liquid crystal material with a holographic function, which switches between transmitting and reflecting states and to which diffusion properties are imparted by exposing the material to diffusing radiation.

The polymer-dispersed liquid crystal material used in this preferred embodiment is obtained by preparing a mixture of a low-molecular-weight liquid crystal composition and an unpolymerized prepolymer in a miscible state, injecting the mixture into the gap between the substrates, and then polymerizing the prepolymer. Any type of polymer-dispersed liquid crystal material may be used as long as the material is obtained by polymerizing a prepolymer. In this preferred embodiment, a mixture of a UV-curing prepolymer with liquid crystalline properties and a liquid crystal composition is photo-cured by being exposed to an active ray such as an ultraviolet ray, and the cured mixture (i.e., a UV-cured liquid crystal material) is used as the polymer-dispersed liquid crystal material. If such a UV-cured liquid crystal material is used as the polymer-dispersed liquid crystal material, the polymerizable liquid crystal material may be polymerized without being heated. Thus, other members of the liquid crystal display device are not affected by the heat generated.

The prepolymer-liquid crystal mixture may be obtained by adding a small amount of polymerization initiator (produced by Ciba-Geigy Corporation, for example) to a mixture of a UV-curing material and a liquid crystal composition that have been mixed at a weight ratio of about 20:80, for example. The prepolymer-liquid crystal mixture obtained in this manner exhibits a nematic liquid crystalline phase at room temperature. On entering a liquid crystal layer made of such a material, the incoming light is modulated in accordance with the mode (i.e., scattering or transmitting mode) of the liquid crystal layer that changes with the voltage applied thereto. In this preferred embodiment, the liquid crystal layer exhibits the scattering state when no voltage is applied thereto and the transmitting state when a voltage is applied thereto.

Hereinafter, it will be described specifically how the reflective liquid crystal display device 100 operates.

First, the operation of the display device 100 in a white display mode will be described. In the white display mode, the liquid crystal layer 60 is controlled to exhibit the scattering state. Thus, externally incoming light is scattered by the liquid crystal layer 60 after having been transmitted through the substrate 80 and the color filter layer 70. In this case, a part of the incoming light, which has been backscattered by the liquid crystal layer 60, returns to the viewer. Also, in the display device of this preferred embodiment, another part of the incoming light that has been transmitted straight through the liquid crystal layer 60 and still another part of the incoming light that has been forward scattered by the liquid crystal layer 60 are reflected by the reflective electrode 25 on the micro corner cube array 20. The reflected parts of the light are scattered again by the liquid crystal layer 60 in the scattering state while passing through the liquid crystal layer 60. As a result, a part of the scattered light returns to the viewer. In this manner, in the white display mode, not only the backscattered light but also a part of the forward scattered light return to the viewer, thus realizing display of a highly bright image.

Next, the operation of the display device 100 in a black display mode will be described. In the black display mode, the liquid crystal layer 60 is controlled to exhibit a transmitting state by being supplied with a voltage. In such a situation, externally incoming light is transmitted through the substrate 80, color filter layer 70 and liquid crystal layer 60. The light that has been transmitted through the liquid crystal layer 60 is retro-reflected by the reflective electrode 25 on the micro corner cube array 20. That is to say, before entering the eyes of the viewer who is watching an image on the display, the incoming light is refracted by the substrate 80 and liquid crystal layer 60, retro-reflected from the micro corner cube array 20 and then refracted by the liquid crystal layer 60 and substrate 80 again. Thus, only the light that has come from the vicinity of the viewer's eyes goes out of this display device 100 toward the viewer. In this case, if the vicinity of the viewer's eyes is too narrow a region to allow any light source to be present there (i.e., if that region is smaller in area than the viewer's pupil), then good black display is realized.

As described above, the light that has been incident onto the micro corner cube array 20 is reflected back in the direction that is precisely opposite to the direction in which the incoming light has traveled. However, the retro-reflected outgoing light ray is slightly shifted horizontally (or translated) from the incoming light ray. The shift is approximately equal to the size (or pitch) of unit elements of the micro corner cube array 20. Accordingly, if the size of unit elements of the micro corner cube array 20 is greater than the size of pixel regions, then the color of a color filter that the incoming light ray passes may be different from that of a color filter that the outgoing light ray passes, thus causing a color mixture unintentionally.

On the other hand, if the size of unit elements of the micro corner cube array 20 is smaller than the size of pixel regions, then the color of a color filter that the incoming light ray passes should be the same as that of the color filter that the outgoing light ray passes, thus causing no color mixture. Accordingly, to display an image in desired colors, the size of unit elements of the micro corner cube array 20 needs to be smaller than the size of pixel regions. In the micro corner cube array 20 for use in this preferred embodiment, the size of unit elements (e.g., about 10 μm) is defined sufficiently smaller than a normal size of a pixel region (e.g., several tens μm). Thus, an image can be appropriately displayed in desired colors.

Next, the retro-reflectivity of a light ray that has been incident straight onto a corner cube consisting of three rectangular isosceles triangular planes will be compared with that of a light ray that has been incident straight onto a corner cube consisting of three square planes. A retroreflector in which each corner cube consists of three rectangular isosceles triangular planes is described in Japanese Laid-Open Publication No. 7-205322.

Figure 9A:
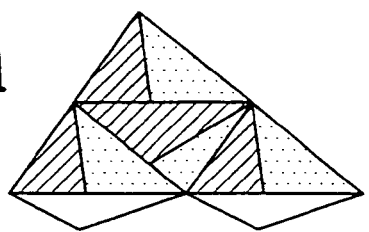
FIGS. 9A and 9B are respectively a perspective view and plan views illustrating an array of corner cubes, each consisting of three rectangular isosceles triangular planes.
Figure 9B:
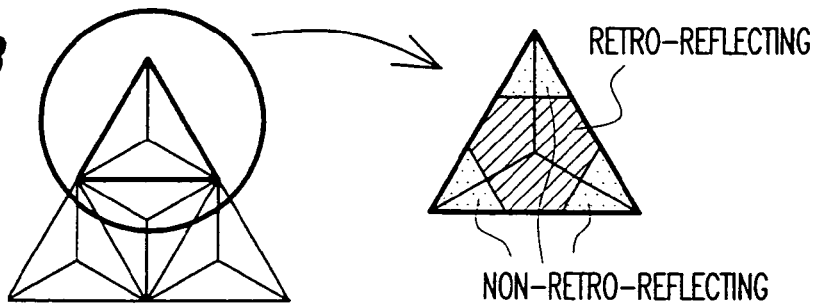

FIGS. 9A and 9B are respectively a perspective view and a plan view illustrating a situation where each corner cube consists of three rectangular isosceles triangular planes. In the situation where each corner cube consists of three rectangular isosceles triangular planes, the corner cube has an equilateral triangular planar shape as shown in FIG. 9B. In that case, if a light ray is incident onto a point of the corner cube near one of the vertices of the equilateral triangle, then the light ray is not retro-reflected because inside the corner cube, there is no point that is symmetric to the point of incidence with respect to the center of the corner cube. Accordingly, the retro-reflectivity is at most about 66%.

Figure 10A:
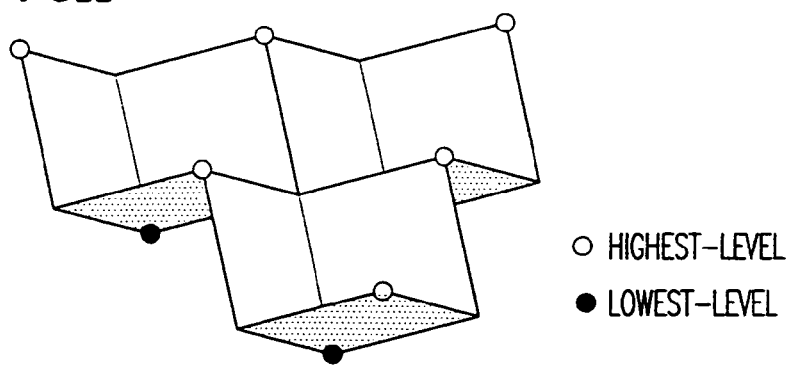
FIGS. 10A and 10B are respectively a perspective view and plan views illustrating an array of corner cubes, each consisting of three square planes.
Figure 10B:
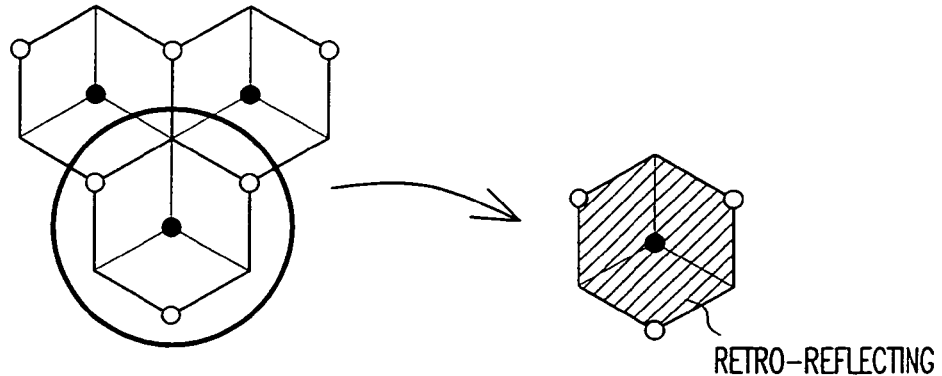

On the other hand, FIGS. 10A and 10B are respectively a perspective view and a plan view illustrating a situation where each corner cube consists of three square planes. In the situation where each corner cube consists of three square planes, the corner cube has a rectangular hexagonal planar shape as shown in FIG. 10B. In that case, no matter where the light ray is incident, each and every point of incidence has a point that is symmetric with respect to the center of the corner cube. Accordingly, a light ray that has been incident onto any point of the rectangular hexagon is always retro-reflected. Thus, it can be seen that to increase the retro-reflectivity of an incoming light ray, each of the micro corner cubes in an array preferably consists of three square planes and preferably has a rectangular hexagonal planar shape.

In the micro corner cube array for use in this preferred embodiment, each unit element thereof consists of three substantially square planes, defined by {100} planes of cubic single crystals, as described above. Thus, the micro corner cube array can retro-reflect the incoming light just as intended. That is to say, in the black display mode, the viewer senses no unwanted light. As a result, appropriate dark display is realized and the contrast ratio increases.

In the preferred embodiment described above, the micro corner cube array according to the preferred embodiment of the present invention is applied to a liquid crystal display device. Alternatively, a retroreflector, made from the micro corner cube array according to the preferred embodiment of the present invention, may be provided behind a light emitter such as an EL device.

As another alternative, a micro corner cube array, having an optical axis that is tilted away from a normal to the reference plane of a base material, may also be made. Specifically, first, a GaAs substrate, having a surface that defines a tilt angle of about 0 degrees to about 10 degrees with the (111)A plane of GaAs crystals, is prepared. Next, the GaAs substrate prepared is subjected to the mirror polishing, photoresist pattern definition and dry etching process steps as in the first preferred embodiment described above, thereby forming multiple corner cubes, each being made up of three {100} crystal planes that are opposed substantially perpendicularly to each other (e.g., (100), (010) and (001) planes), on the surface of the substrate. In this manner, a corner cube array is obtained. In this preferred embodiment, however, the GaAs substrate has a surface that is tilted away from {111}A planes of the crystals by about 0 degrees to about 10 degrees unlike the first preferred embodiment described above. Accordingly, the angle that is defined by each of the three planes of a corner cube with the reference plane of the substrate (i.e., the original surface of the substrate yet to be etched) is different from that of the first preferred embodiment.

If the corner cube array that has been formed in this manner on the surface of the GaAs substrate is coated with a reflective film as already described for the first preferred embodiment, then the corner cube array may be used as a retroreflector. The retroreflector obtained in this manner has an optical axis that is tilted away from a normal to the reference plane of the substrate, and exhibits the highest retro-reflectivity with respect to an incoming light ray that has been incident along the tilted optical axis. Thus, depending on the operating environment of a display device (when the light source is located at a fixed position, for example), higher display performance is realized by using such a retroreflector.

According to the present invention, a micro corner cube array is made by dry-etching the {111} planes of a cubic single crystalline substrate anisotropically such that each of multiple unit elements is made up of crystallographic planes that have been exposed at a relatively low etch rate (e.g., {100} planes). Thus, a micro corner cube array, consisting of very small unit elements that have a size even smaller than that of a pixel region of the display device (e.g., about several tens μm) and yet exhibiting very high shape precision, can be made through relatively simple process steps.

A display device including such a micro corner cube array can display a bright image at a high contrast ratio, a high color purity and highly visibility.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A micro corner cube array comprising:
    a substrate, at least a surface portion of which comprises cubic single crystals;
    a plurality of unit elements of the micro corner cube array, at least some of said unit elements including a number of crystal planes of the cubic single crystals that have been etched at a lower dry etch rate than {111} planes of the cubic single crystals; and
    wherein the crystal planes of the at least some of said unit elements include three square {100} planes of the cubic single crystals, the ratio ($V_{100}/V_{111A}$) of the dry etch rate $V_{100}$ of the {100} planes of the cubic single crystals to the dry etch rate $V_{111A}$ of the {111}A planes of the cubic single crystals being $1/3.4$ or less.

2. A display device comprising: the micro corner cube array as recited in claim 1; and a light modulating layer provided on the micro corner cube array.

3. The display device of claim 2, wherein the display device comprises pixels, each of which is defined by a pixel region; and wherein the micro corner cube array comprises a plurality of corner cubes as the unit elements, and wherein a size of each said corner cube is equal to or smaller than that of each pixel region.

* * * * *